United States Patent
Park et al.

(10) Patent No.: US 7,773,402 B2
(45) Date of Patent: Aug. 10, 2010

(54) SEMICONDUCTOR MEMORY APPARATUS

(75) Inventors: Sang Park, Gyeonggi-do (KR); Shin Ho Chu, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/483,482

(22) Filed: Jun. 12, 2009

(65) Prior Publication Data

US 2009/0251985 A1    Oct. 8, 2009

Related U.S. Application Data

(62) Division of application No. 11/647,483, filed on Dec. 29, 2006, now Pat. No. 7,554,871.

(30) Foreign Application Priority Data

Jun. 8, 2006    (KR) ............... 10-2006-0051223

(51) Int. Cl.
*G11C 5/00* (2006.01)
*G11C 5/14* (2006.01)
*G11C 7/00* (2006.01)

(52) U.S. Cl. ................ 365/52; 365/222; 365/226; 365/227; 365/228; 365/229; 365/189.07; 365/189.08; 365/189.09; 365/189.11

(58) Field of Classification Search .......... 365/52, 365/222, 226, 227, 228, 229, 189.07, 189.08, 365/189.09, 189.11

See application file for complete search history.

(56) References Cited

U.S. PATENT DOCUMENTS

| | | | |
|---|---|---|---|
| 6,130,829 | A | 10/2000 | Shin |
| 6,137,743 | A | 10/2000 | Kim |
| 6,172,932 | B1 | 1/2001 | Kim |
| 6,285,622 | B1 | 9/2001 | Haraguchi et al. |
| 6,418,075 | B2 | 7/2002 | Shimano et al. |
| 6,452,854 | B1 | 9/2002 | Kato et al. |
| 6,504,783 | B2 | 1/2003 | Jo |
| 6,882,215 | B1 | 4/2005 | Lee |
| 6,922,369 | B2 | 7/2005 | Kim |
| 7,002,854 | B2 | 2/2006 | Takahashi et al. |
| 7,038,937 | B2 | 5/2006 | Lines |
| 7,123,536 | B2 | 10/2006 | Kang |
| 7,266,031 | B2 | 9/2007 | Kim et al. |
| 7,301,848 | B2 | 11/2007 | Jin |
| 7,339,849 | B2 | 3/2008 | Jeong |

FOREIGN PATENT DOCUMENTS

JP        7105681        4/1995

(Continued)

*Primary Examiner*—Trong Phan
(74) *Attorney, Agent, or Firm*—Venable LLP; Jeffri A. Kaminski

(57) ABSTRACT

A first signal input circuit outputs a first control signal in response to self-refresh and active signals. A second signal input circuit outputs a second control signal in response to the self-refresh and active signals. The power supply circuit applies a first supply voltage to an output terminal in response to the first control signal. An elevated voltage generator generates a elevated voltage by pumping a second supply voltage, and applies the elevated voltage to the output terminal, in response to the first and second control signals.

8 Claims, 3 Drawing Sheets

FOREIGN PATENT DOCUMENTS

| | | |
|---|---|---|
| JP | 9147553 | 6/1997 |
| JP | 11203865 | 7/1999 |
| JP | 11345488 | 12/1999 |
| JP | 2002170387 | 6/2002 |
| KR | 1019980022291 | 7/1998 |
| KR | 1019990013050 | 2/1999 |
| KR | 1019990053727 | 7/1999 |
| KR | 1020050049631 | 5/2005 |

SEMICONDUCTOR MEMORY APPARATUS

CROSS-REFERENCE TO RELATED PATENT APPLICATION

This application is a divisional of U.S. patent application Ser. No. 11/647,483 which is now U.S. Pat. No. 7,554,871, filed Dec. 29, 2006, the subject matter of which application is incorporated herein by reference in its entirety.

This application claims the benefit of Korean Patent Application No. 10-2006-0051223, filed on Jun. 8, 2006, in the Korean Intellectual Property Office, the disclosure of which is incorporated herein in its entirety by reference.

FIELD OF THE INVENTION

1. Technical Field

The present invention relates to a semiconductor memory apparatus and more particularly, to a semiconductor memory apparatus that reduces current consumption when using an elevated voltage.

2. Related Art

Semiconductor memory apparatuses have required an elevated voltage (VPP) higher than an external supply voltage (VDD). Such elevated voltage may be used to maintain a gate voltage of a cell transistor in semiconductor memory apparatuses, and to activate word lines in active operations. Also, the elevated voltage is used to compensate a loss of a threshold voltage in a data output buffer. Therefore, the conventional semiconductor memory apparatus needs an elevated voltage generator.

The conventional elevated voltage generator pumps the external supply voltage (VDD), to generate the elevated voltage (VPP) for activating word lines.

However it is difficult to have a pumping efficiency over 25%. For example, if a 40 μA current is required to generate the elevated voltage (VPP), about a 160 μA current flowing into a pumping circuit is required, thereby causing unnecessary current consumption.

Even while a semiconductor memory apparatus is in a standby mode, the elevated voltage is usually maintained through pumping the external supply voltage (VDD). Thus, a large amount of current is dissipated due to the low efficiency of pumping the external supply voltage.

Moreover, as gate channel lengths become shorter with the advancement of semiconductor technology, off-leakage currents through transistors increase. Thus, it is difficult to satisfy current specifications in standby mode. In particular, unnecessary current consumption is very disadvantageous when developing semiconductor memory apparatus for mobile systems, which must minimize the rate of current consumption to be competitive in the mobile market.

SUMMARY OF THE INVENTION

Embodiments of the present invention provide a semiconductor memory apparatus capable of using an external voltage having a level of an elevated voltage, instead of the elevated voltage, in standby mode but using the elevated voltage in an active mode.

According to a first embodiment of the present invention, a semiconductor memory apparatus includes an output terminal, a first signal input circuit configured to output a first control signal when self-refresh and active signals are both deactivated; a second signal input circuit configured to output a second control signal when at least one of the self-refresh and active signals is activated, a power supply circuit configured to apply a first supply voltage to the output terminal in response to the first control signal as an elevated voltage, wherein the first supply voltage is an external voltage, and an elevated voltage generator configured to generate the [an] elevated voltage by pumping a second supply voltage, and to apply the elevated voltage to the output terminal, in response to the first and second control signals, wherein the second supply voltage is the external voltage, wherein the first supply voltage is higher than the second supply voltage.

According to a second embodiment of the present invention, a semiconductor memory apparatus includes an output terminal, a power supply circuit configured to apply a first supply voltage to the output terminal in response to self-refresh and active signals, and an elevated voltage generator configured to apply an elevated voltage, which is generated by pumping a second supply voltage, to the output terminal in response to the self-refresh and active signals, wherein the first supply voltage is provided to the output terminal as the elevated voltage when an operating mode is a standby mode, and the elevated voltage is provided to the output terminal when the operating mode is a self-refresh mode or an active mode.

A further understanding of the nature and advantages of the present invention herein may be obtained from the remaining portions of the specification with reference to the attached drawings.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF EXEMPLARY EMBODIMENT

Figure 1:
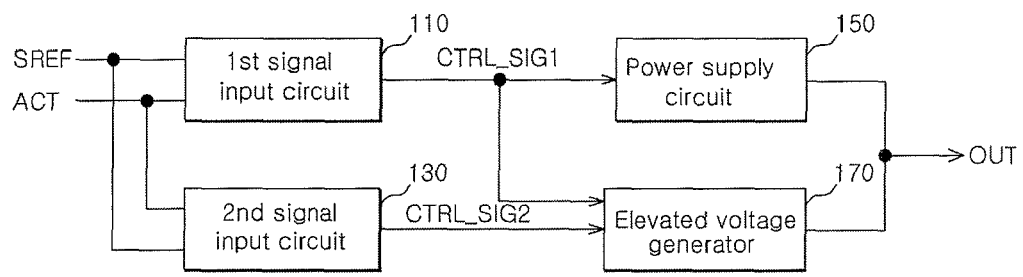
FIG. 1 is a block diagram of a semiconductor memory apparatus according to an embodiment of the present invention.

Preferred embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

Hereinafter, embodiments of the present invention will now be described in detail with reference to the accompanying drawings.

Referring to FIG. 1, the semiconductor memory apparatus according to an embodiment of the present invention may include a first signal input circuit 110, a second signal input circuit 130, a power supply circuit 150, and an elevated voltage generator 170.

The first input circuit 110 generates a first control signal CTRL_SIG1 in response to a self-refresh signal SREF and an active signal ACT. The second input circuit 130 generates a second control signal CTRL_SIG2 in response to the self-refresh signal SREF and the active signal ACT. The power supply circuit 150 applies a first supply voltage NVDD to an output terminal OUT in response to the first control signal CTRL_SIG1. The elevated voltage generator 170 generates an elevated voltage VPP by pumping a second supply voltage VDD in response to the first and second control signals CTRL_SIG1 and CTRL_SIG2 and applies the elevated voltage VPP to the output terminal OUT.

The self-refresh signal SREF is provided to refresh memory cells, and the active signal ACT is provided to activate a memory bank and enable data input/output operations.

The semiconductor memory apparatus may be configured such that the first supply voltage NVDD may be applied to the output terminal OUT instead of the elevated voltage VPP when the self-refresh signal SREF and the active signal ACT are both inactive, and the elevated voltage VPP may be applied to the output terminal OUT when one of the self-refresh signal SREF and the active signal ACT is active.

The first signal input circuit 110 executes an OR operation to output the first control signal CTRL_SIG1 which is activated when one of the self-refresh signal SREF and the active signal ACT is active.

The second signal input circuit 130 executes a NOR operation to output the second control signal CTRL_SIG2 which is activated when the self-refresh signal SREF and the active signal ACT are both inactive.

The first and second supply voltages NVDD and VDD are externally supplied. The first supply voltage NVDD is higher than the second supply voltage VDD. The first supply voltage NVDD may be set at a potential between about 0.7×VPP and about 1.3×VPP.

Figure 2:
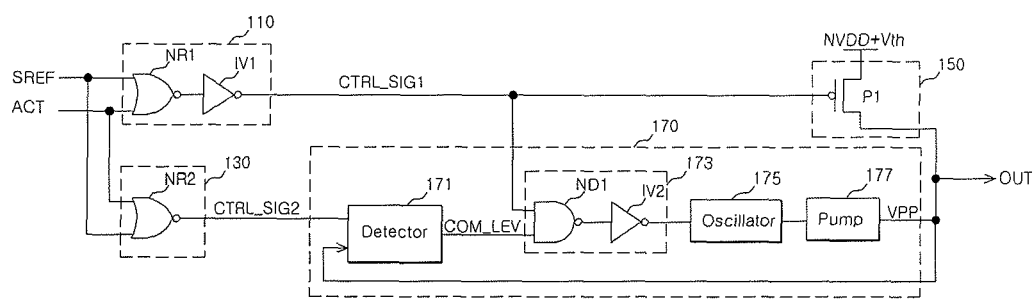
FIG. 2 is a circuit diagram of the semiconductor memory apparatus shown in FIG. 1.

Referring to FIG. 2, the first signal input circuit 110 may be comprised of a first NOR gate NR1 and a first inverter IV1.

The first NOR gate NR1 receives the self-refresh signal SREF and the active signal ACT. The first inverter IV1 outputs the first control signal CTRL_SIG1 through inverting an output signal of the first NOR gate NR1.

The second signal input circuit 130 may be comprised of a second NOR gate NR2.

The second NOR gate NR2 receives the self-refresh signal SREF and the active signal ACT and then outputs the second control signal CTRL_SIG2.

The power supply circuit 150 may be comprised of a first PMOS transistor P1.

For example, the first PMOS transistor P1 may have a gate node that receives the first control signal CTRL_SIG1, a source node that receives a voltage being a sum of the first supply voltage NVDD and a threshold voltage Vth of the first PMOS transistor P1, and a drain node that is coupled to the output terminal OUT. For example, the threshold voltage Vth of the PMOS transistor P1 may be a negligible value. The power supply circuit 150 may also be implemented by any type of switch activated in response to the first control signal CTRL_SIG1.

The elevated voltage generator 170 may include a detector 171, an operation controller 173, an oscillator 175, and a pump 177. The detector 171 is enabled in response to the second control signal CTRL_SIG2, and outputs a comparison signal COM_LEV by comparing a feed-back elevated voltage VPP to a reference voltage VREF. The operation controller 173 outputs a pump enable signal (not shown) which is only active when the comparison signal COM_LEV and the first control signal CTRL_SIG1 are both active. The oscillator 175 outputs an oscillation signal (not shown) in response to the pump enable signal. The pump 177 generates the elevated voltage VPP by pumping the second supply voltage VDD in response to the oscillation signal.

The operation controller 173 performs an AND operation via a NAND gate ND1 that receives the first control signal CTRL_SIG1 and the comparison signal COM_LEV, and a second inverter IV2 that inverts an output signal of the NAND gate ND1.

Figure 3:
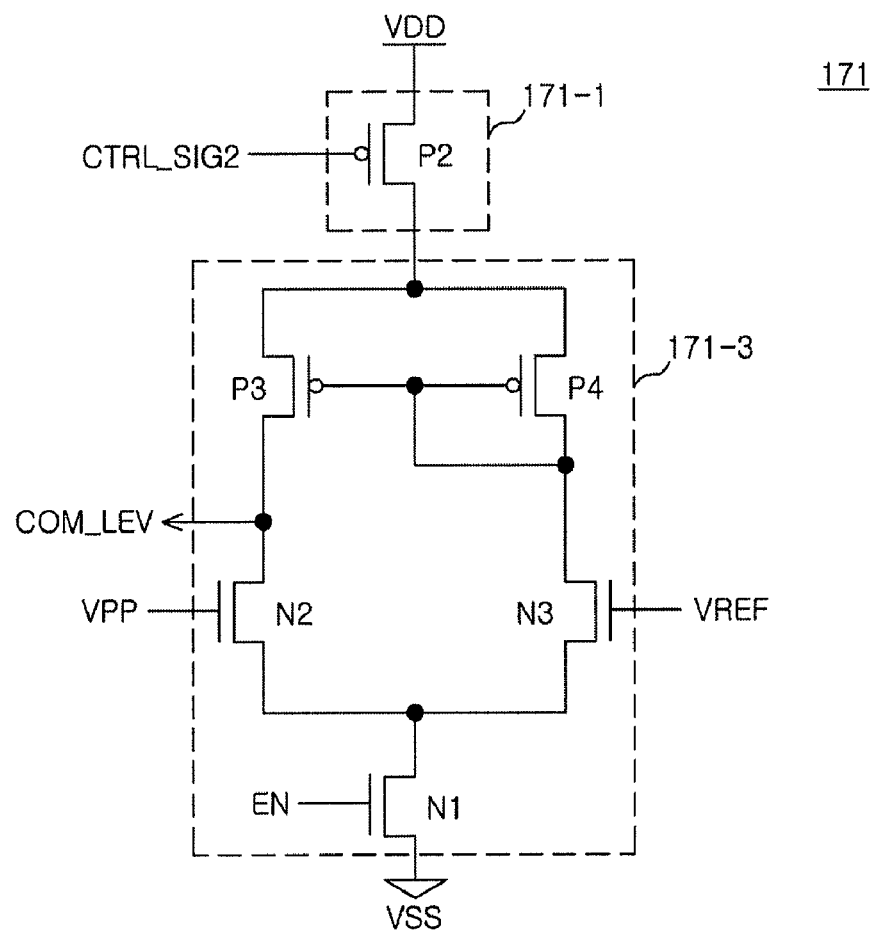
FIG. 3 is a circuit diagram of the detector shown in FIG. 2.

FIG. 3 is a circuit diagram of the detector 171 shown in FIG. 2.

Referring to FIG. 3, the detector 171 is comprised of a switching circuit 171-1 and a comparator 171-3. The switching circuit 171-1 activates or deactivates the detector 171 in response to the second control signal CTRL_SIG2. The comparator 171-3 outputs the comparison signal COM_LEV by comparing the feed-back elevated voltage VPP with the reference voltage VREF.

The switching circuit 171-1 may include a second PMOS transistor P2. The second PMOS transistor P2 has a gate node that receives the second control signal CTRL_SIG2, a source node that receives the second supply voltage VDD, and a drain node that is coupled to the comparator 173-3. The switching circuit 171-1 may also be implemented by a any type of switch activated in response to the second control signal CTRL_SIG2.

The comparator 171-3 may comprise third and fourth PMOS transistors P3 and P4, and first through third NMOS transistors N1~N3.

A source of the third PMOS transistor P3 is commonly coupled to a source of the fourth PMOS transistors P4. A gate of the third PMOS transistor P3 is commonly coupled to a gate of the fourth PMOS transistor P4. Also, the gate of the fourth PMOS transistor P4 (or the third PMOS transistor P3) is coupled to a drain of the fourth PMOS transistor to form a current mirror. The first NMOS transistor N1, which receives an enable signal EN through its gate node, is coupled to a ground voltage terminal VSS through its source node. The second NMOS transistor N2, which receives the elevated voltage VPP through its gate node, is connected to the drain of the third PMOS transistor P3 through its drain node and is coupled to the drain node of the first NMOS transistor N1 through its source node. The third NMOS transistor N3, which receives the reference voltage VREF through its gate node, is coupled to the drain node of the fourth PMOS transistor P4 through its drain node and is coupled to the drain node of the first NMOS transistor N1 through its source node.

A common node connecting the fourth PMOS transistor P4 and the third NMOS transistor N3 to each other is coupled with the gate node of the third PMOS transistor P3. The comparison signal COM_LEV is output from a common node at which the third PMOS transistor P3 is connected with the second NMOS transistor N2.

The comparator 171-3, which compares the elevated voltage VPP with the reference voltage VREF in the detector 171, may be implemented as another circuit operating in response to the second control signal CTRL_SIG2.

Hereinafter, an operation of the semiconductor memory apparatus according to an embodiment of the present invention will be described.

When both the self-refresh signal SREF and the active signal ACT are inactive, the first supply voltage NVDD is applied to the output terminal OUT in response to the first control signal CTRL_SIG1. The elevated voltage generator 170 is deactivated in response to the first and second control signals CTRL_SIG1 and CTRL_SIG2, so that the elevated voltage VPP is not generated.

Meanwhile, when one of the self-refresh signal SREF or the active signal ACT is active, the power supply circuit 150 interrupts the first supply voltage NVDD to the output terminal OUT in response to the first control signal CTRL_SIG1, and the elevated voltage generator 170 applies the elevated voltage VPP to the output terminal OUT in response to the first and second control signals CTRL_SIG1 and CTRL_SIG2.

In other words, the first supply voltage NVDD is transferred to the output terminal OUT in a standby mode for which the self-refresh signal SREF and the active signal ACT are both inactive, while the elevated voltage VPP is applied to the output terminal OUT in an active mode. Thereby, current dissipated according to a low pumping efficiency, while generating the elevated voltage VPP by pumping the second supply voltage VDD, may be reduced in the standby mode.

In more detail, with reference to FIGS. 2 and 3, since the first supply voltage NVDD may cause the memory operation to be unstable, the elevated voltage VPP provided from the elevated voltage generator 170 is used in the active mode for which one of the self-refresh signal SREF or the active signal ACT is active at a high level.

Namely, in the active mode, the first signal input circuit 110 outputs the first control signal CTRL_SIG1 at a high level while the second signal input circuit 130 outputs the second control signal CTRL_SIG2 at a low level.

The first PMOS transistor P1 of the power supply circuit 150 that receives the first control signal CTRL_SIG1 is turned off to interrupt the first supply voltage NVDD to the output terminal OUT.

The detector 171 receives the second control signal CTRL_SIG2 and turns the second PMOS transistor P2 of the switching circuit 171-1 on to supply the second supply voltage VDD to the comparator 171-3. Then, the comparator 171-3 is enabled to compare the elevated voltage VPP with the reference voltage VREF, and outputs the comparison signal COM_LEV.

The operation controller 173 receives the first control signal CTRL_SIG1 at a high level, activates the pump enable signal (not shown), and makes the oscillator 175 output the oscillation signal (not shown) when the comparison signal COM_LEV is at high level.

In response to the oscillation signal (not shown), the elevated voltage VPP, generated by pumping the second supply voltage VDD by the pump 177, is applied to the output terminal OUT. When the comparison signal COM_LEV becomes low level, the oscillator 175 is disabled to permit a normal operation for generating the elevated voltage.

On the other hand, in the standby mode for which the self-refresh signal SREF and the active signal ACT are both inactive at a low level, the first supply voltage NVDD is used to maintain word lines at a voltage level near the elevated voltage VPP, which makes it easy to conduct a normal operation when the active mode begins from the standby mode.

Namely, in the standby mode, the first signal input circuit 110 generates the first control signal CTRL_SIG1 at a low level and the second input circuit 130 generates the second control signal CTRL_SIG2 at a high level.

The first PMOS transistor P1 of the power supply circuit 150 receives the first control signal CTRL_SIG1 and is turned on to supply the first supply voltage NVDD to the output terminal OUT.

The detector 171 receives the second control signal CTRL_SIG2 and turns the second PMOS transistor P2 of the switching circuit 171-1 on to interrupt the second supply voltage VDD to the comparator 171-3. Then, the comparator 171-3 is disabled to reduce the rate of current unnecessarily dissipated by the detector 171.

The operation controller 173 receives the first control signal CTRL_SIG1 at a low level, and outputs the pump enable signal, which is normally inactive, regardless of the comparison signal COM_LEV, so that the oscillator 175 is disabled to shut off the pumping operation of the elevated voltage generator 170 by the pump 177. Thus, it is possible to reduce current consumption due to a low pumping efficiency.

As mentioned before, in the standby mode, the semiconductor memory apparatus described above operates with the first supply voltage NVDD at a level close to the elevated voltage VPP. Therefore, it is possible to reduce current unnecessarily consumed by pumping the second supply voltage VDD to maintain the elevated voltage VPP in the conventional semiconductor memory apparatus in the standby mode.

Further, the described semiconductor memory apparatus assures a normal operation even when returning to the active mode from the standby mode.

Figure 4:
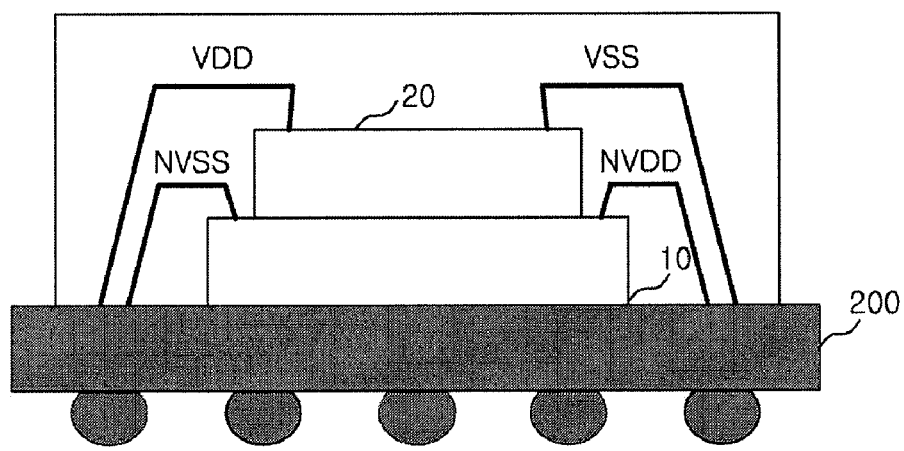
FIG. 4 is a sectional diagram of a conventional semiconductor memory apparatus with a multi-chip package structure.

FIG. 4 is a sectional diagram of a conventional semiconductor memory apparatus with a multi-chip package (MCP) structure.

The MCP is an assembly technique used for greatly shrinking down a product size by stacking two or more semiconductor chips in a single package, and is regarded as an effective method of miniaturization and ensuring light-weight devices such as mobile phones.

As illustrated in FIG. 4, a conventional MCP semiconductor memory apparatus includes a printed circuit board 200; a first memory chip 10 receiving the first supply voltage NVDD, mounted on the printed circuit board 200; and a second memory chip 20 receiving the second supply voltage VDD, mounted on the first memory chip 10.

Figure 5:
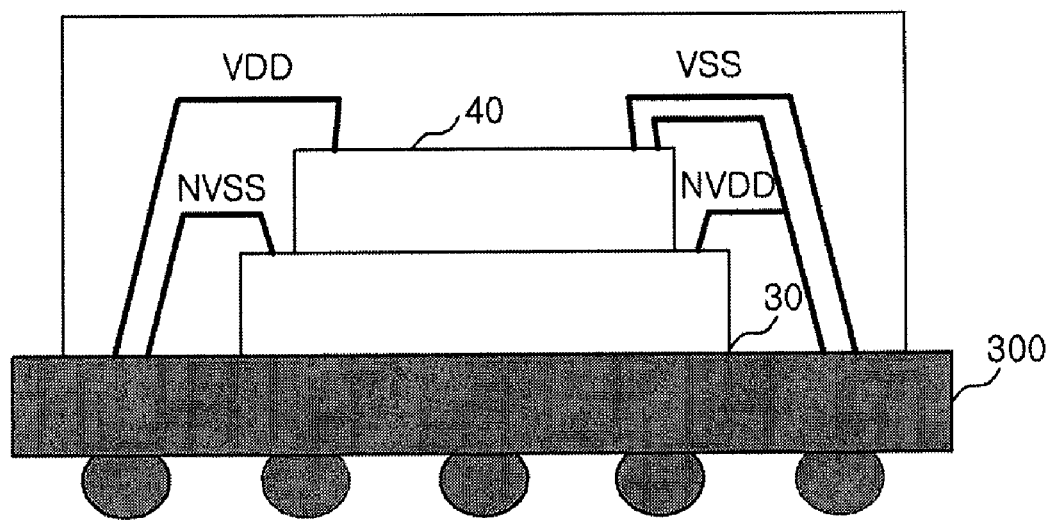
FIG. 5 is a sectional diagram of a semiconductor memory apparatus according to an embodiment of the present invention, having a multi-chip package structure capable of applying first and second supply voltages.

FIG. 5 is a sectional diagram of a semiconductor memory apparatus according to an embodiment of the present invention, having a MCP structure capable of applying first and second supply voltages.

Referring to FIG. 5, the MCP semiconductor memory apparatus according to the present invention may include a printed circuit board 300, a first memory chip 30, and a second memory chip 40.

The first memory chip 30 receives a substantial first supply voltage NVDD. The second memory chip 40 receives the first and second supply voltages NVDD and VDD together.

The second memory chip 40, having the structure shown in FIG. 1, includes a first signal input circuit 110, a second signal input circuit 130, a power supply circuit 150, and an elevated voltage generator 170. The first input circuit 110 generates the first control signal CTRL_SIG1 in response to the self-refresh signal SREF and an active signal ACT. The second input circuit 130 generates the second control signal CTRL_SIG2 in response to the self-refresh signal SREF and the active signal ACT. The power supply circuit 150 applies the first supply voltage NVDD to the output terminal OUT in response to the first control signal CTRL_SIG1. The elevated voltage generator 170 generates the elevated voltage VPP by pumping a second supply voltage VDD in response to the first and second control signals CTRL_SIG1 and CTRL_SIG2, and applies the elevated voltage VPP to the output terminal OUT.

The first memory chip 30 may be implemented by a nonvolatile memory capable of reading and writing data from and into memory cells, e.g., a flash RAM.

The second memory chip 40 may be implemented by a volatile memory capable of reading and writing data from and into memory cells, e.g., a dynamic RAM.

The first and second supply voltages NVDD and VDD are externally supplied. The first supply voltage NVDD may be higher than the second supply voltage VDD. For instance, the second supply voltage VDD may be a 1.8V power source voltage for a dynamic RAM that is used as the second memory 40, while the first supply voltage NVDD may be 2.7~3.3V for a flash RAM that is used as the first memory 30.

Figure 6:
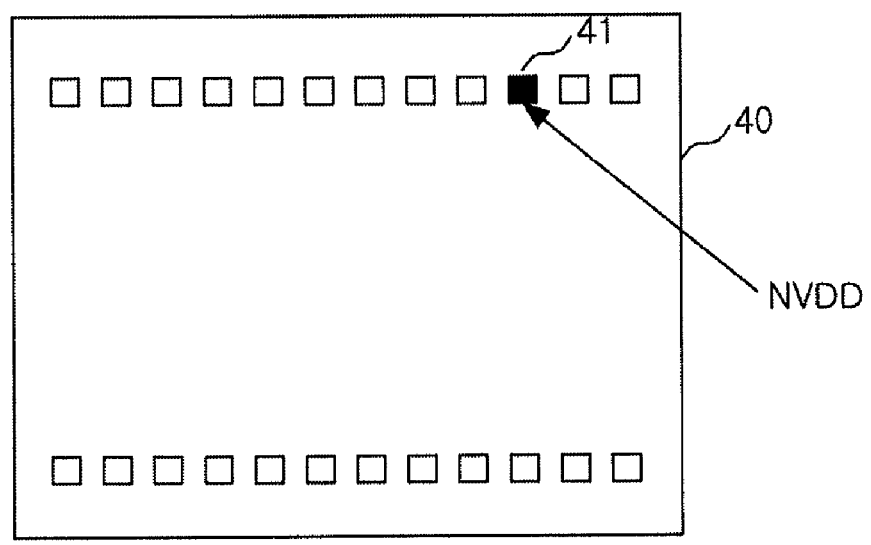
FIG. 6 is an architectural diagram of pads of the second memory shown in FIG. 5.

Referring to FIG. 6, the second memory chip 40 may further include an input pad 41 for receiving the first supply voltage NVDD, which is higher than the second supply voltage VDD.

As mentioned before, the semiconductor memory apparatus according to embodiments of the present invention is available in the MCP structure. Namely, the conventional MCP structure as shown in FIG. 4 may be modified to the structure shown in FIG. 5. The first supply voltage NVDD is applied to the second memory 40, which includes the elevated voltage generator 170 that outputs the elevated voltage VPP by pumping the second supply voltage VDD. The second memory 40 uses the first supply voltage NVDD instead of the elevated voltage VPP in the standby mode, and uses the elevated voltage VPP, which is generated by pumping the second supply voltage VDD, in the active mode, which reduces current consumption of when the elevated voltage VPP is generated by pumping the second supply voltage VDD in the standby mode.

While in the aforementioned embodiment the first supply voltage NVDD is higher than the elevated voltage VPP, it is possible in practice that the first supply voltage NVDD is an external voltage lower than the elevated voltage VPP by a predetermined level.

Moreover, the MCP semiconductor memory apparatus is just an example illustrating an embodiment of the present invention without any restriction hereto.

As described above, the semiconductor memory apparatus according to embodiments of the present invention reduces the amount of current consumed by the elevated voltage generator during the standby mode.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor memory apparatus having a multi-chip package structure, comprising:
   a first memory chip configured to receive a first supply voltage; and
   a second memory chip configured to receive the first supply voltage and a second supply voltage and comprising: an output terminal; a power supply circuit configured to apply the first supply voltage to the output terminal in response to self-refresh and active signals; and an elevated voltage generator configured to apply an elevated voltage, which is generated by pumping the second supply voltage, to the output terminal in response to the self-refresh and active signals.

2. The semiconductor memory apparatus as set forth in claim 1, wherein the first and second supply voltages are external voltages.

3. The semiconductor memory apparatus as set forth in claim 2, wherein the first supply voltage is higher than the second supply voltage.

4. The semiconductor memory apparatus as set forth in claim 3, wherein the first supply voltage has a potential between about 0.7 times the elevated voltage and about 1.3 times the elevated voltage.

5. The semiconductor memory apparatus as set forth in claim 4, wherein the power supply circuit is activated when the self-refresh and active signals are both deactivated.

6. The semiconductor memory apparatus as set forth in claim 5, wherein the elevated voltage generator is activated when one of the self-refresh and active signals is activated.

7. The semiconductor memory apparatus as set forth in claim 6, further comprising an input pad configured to accept the first supply voltage in addition to pads of the second memory chip.

8. The semiconductor memory apparatus as set forth in claim 7, wherein the first memory chip comprises a flash memory.

* * * * *